United States Patent
Long

(10) Patent No.: US 10,673,454 B1
(45) Date of Patent: Jun. 2, 2020

(54) COMPARATOR CIRCUIT AND ANALOG TO DIGITAL CONVERTER

(71) Applicant: REALTEK SEMICONDUCTOR CORP., Hsinchu (TW)

(72) Inventor: Yuan-Dong Long, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/430,953

(22) Filed: Jun. 4, 2019

(30) Foreign Application Priority Data

Dec. 21, 2018 (CN) .......................... 2018 1 1577291

(51) Int. Cl.
*H03M 1/46* (2006.01)
*H03K 3/356* (2006.01)
*G05F 1/10* (2006.01)

(52) U.S. Cl.
CPC .............. *H03M 1/466* (2013.01); *G05F 1/10* (2013.01); *H03K 3/356052* (2013.01)

(58) Field of Classification Search
CPC ..... H03M 1/466; G05F 1/10; H03K 3/356052
USPC .................................................. 341/155, 118
See application file for complete search history.

(56) References Cited

U.S. PATENT DOCUMENTS

| 6,232,809 B1 | 5/2001 | Edwards | |
| 7,777,467 B2 * | 8/2010 | Nishida | H02M 3/1582 323/282 |
| 10,530,346 B2 * | 1/2020 | Mattia | H03K 3/011 |
| 10,531,036 B2 * | 1/2020 | Ogawa | H04N 5/374 |
| 10,536,143 B1 * | 1/2020 | Price | G01R 19/16576 |

FOREIGN PATENT DOCUMENTS

| TW | I635702 B | 9/2018 |
| TW | I640168 B | 11/2018 |

OTHER PUBLICATIONS

Kauffman et al., "An 8.5 mW Continuous-Time ΔΣ Modulator With 25 MHz Bandwidth Using Digital Background DAC Linearization to Achieve 63.5 dB SNDR and 81 dB SFDR", IEEE Journal of Solid-State Circuits, vol. 46, No. 12, Dec. 2011, pp. 2869-2881.
Shu, "A 6b 3GS/s 11mW Fully Dynamic Flash ADC in 40nm CMOS with Reduced Number of Comparators", 2012 Symposium on VLSI Circuits Digest of Technical Papers, 2012, pp. 26-27.

* cited by examiner

*Primary Examiner* — Brian K Young
(74) *Attorney, Agent, or Firm* — Birch, Stewart, Kolasch & Birch, LLP

(57) ABSTRACT

A comparator circuit is applied to comparing an input voltage and a reference voltage to generate a comparison result. The comparator circuit includes a resistor circuit, a current source circuit and a transistor switching circuit. The resistor circuit receives first and second input voltages in the input voltage. The current source circuit provides a first current and a second current, and the first current, the second current and the resistor circuit generate the reference voltage. The transistor switching circuit generates the comparison result at its output end according to a first control voltage and a second control voltage at its input end. The current source circuit and the resistor circuit generate the first control voltage according to the first current and the first input voltage, and generate the second control voltage according to the second current and the second input voltage.

20 Claims, 4 Drawing Sheets

COMPARATOR CIRCUIT AND ANALOG TO DIGITAL CONVERTER

CROSS-REFERENCE TO RELATED APPLICATION

This non-provisional application claims priority under 35 U.S.C. § 119(a) to Patent Application No. 201811577291.5 filed in China, P.R.C. on Dec. 21, 2018, the entire contents of which are hereby incorporated by reference.

BACKGROUND

Technical Field

The present disclosure relates to a comparator circuit, in particular to a comparator circuit applied to an analog to digital converter (ADC).

Related Art

In common signal processing applications, for example, digital wireless communication system, digital voice processing and digital image processing applications, a high-speed and high-resolution converter is required. In various high-speed ADCs, a conversion speed of a flash ADC is relatively high.

A conventional flash ADC compares an input voltage and a reference voltage by use of a comparator circuit to generate a thermometer code and then converts the thermometer code into a digital code by use of a decoder. Herein, the comparator circuit used by the conventional flash ADC mostly adopts an auto zero comparator, and a circuit structure of the auto zero comparator usually consists of a preamplifier and a latch. However, such a comparator circuit is relatively high in power consumption and relatively complex in wiring.

Another common comparator circuit substantially consists of four input metallic oxide semiconductor field effect transistors (MOSFETs). However, such a comparator circuit requires input of the four input MOSFETs and parasitic capacitance of output ends is relatively high, which may reduce a conversion speed. Although there is a comparator circuit adopting two input MOSFETs, an offset calibration circuit is designed at an output end and thus its conversion speed is also relatively low.

SUMMARY

In an embodiment, a comparator circuit is applied to comparing an input voltage and a reference voltage to generate a comparison result. The input voltage includes a first input voltage and a second input voltage. The comparator circuit includes a resistor circuit, a current source circuit and a transistor switching circuit. The resistor circuit receives the first input voltage and the second input voltage. The current source circuit provides a first current and a second current, and the first current, the second current and the resistor circuit generate the reference voltage. The transistor switching circuit includes an input end and an output end, and generates the comparison result at its output end according to a first control voltage and a second control voltage at its input end. The current source circuit and the resistor circuit generate the first control voltage according to the first current and the first input voltage, and generate the second control voltage according to the second current and the second input voltage.

In an embodiment, a comparator circuit is applied to comparing an input voltage and a reference voltage to generate a comparison result. The comparator circuit includes a resistor circuit, a current source circuit and a transistor switching circuit. The resistor circuit receives the input voltage. The current source circuit provides a first current. The first current and the resistor circuit generate the reference voltage. The transistor switching circuit includes an input end and an output end, and generates the comparison result at its output end according to a control voltage at its input end. The current source circuit and the resistor circuit generate the control voltage according to the input voltage and the reference voltage.

In an embodiment, an ADC is applied to converting an input voltage into a digital signal. The input voltage includes a first input voltage and a second input voltage. The ADC includes a resistor circuit, a current source circuit, a transistor switching circuit and a decoder. The resistor circuit receives the first input voltage and the second input voltage. The current source circuit provides a first current and a second current. The transistor switching circuit includes an input end and an output end, and generates a comparison result at the output end according to a first control voltage and a second control voltage at the input end. The current source circuit and the resistor circuit generate the first control voltage according to the first current and the first input voltage, and generate the second control voltage according to the second current and the second input voltage. The decoder converts the comparison result into the digital signal.

Based on the above, output capacitance of the output end of a comparison stage can be lowered by adopting the comparator circuit and ADC of the present disclosure, so that the overall conversion speed may be improved.

DETAILED DESCRIPTION

Figure 1:
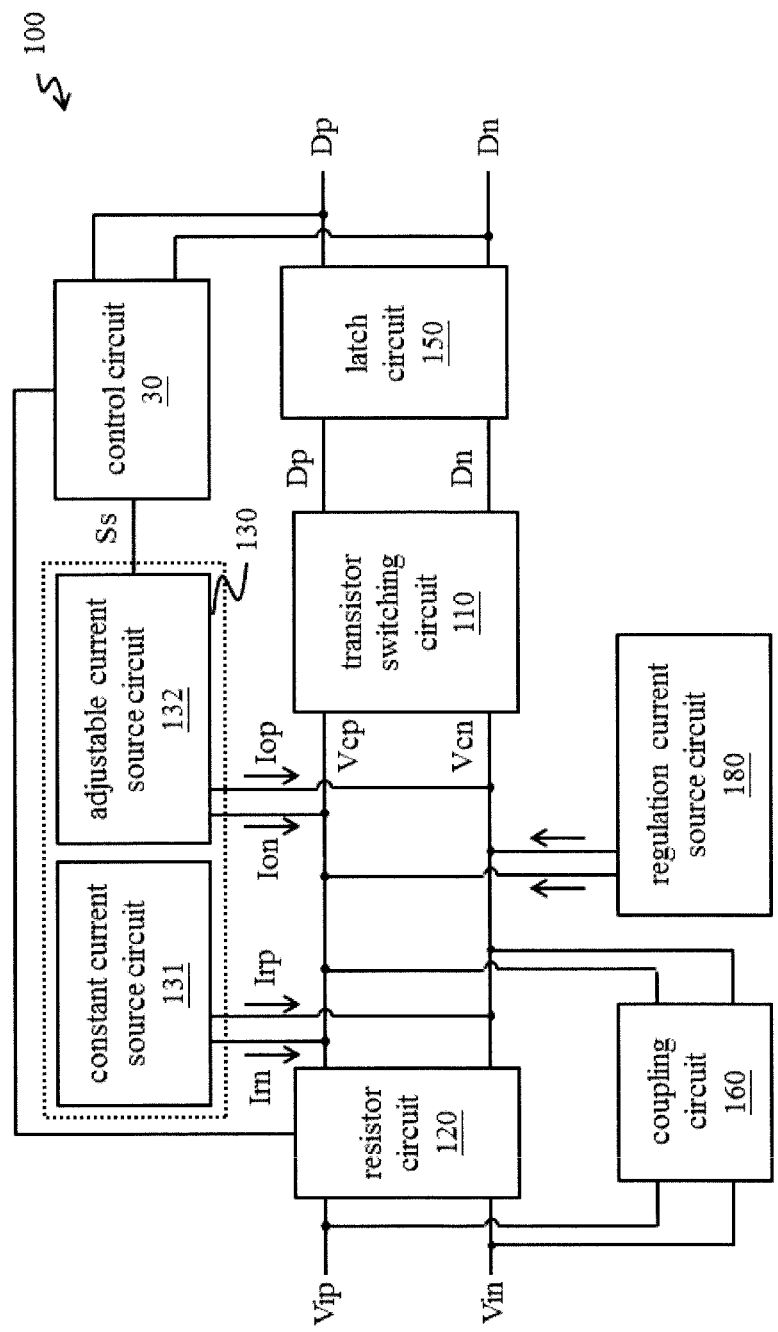
FIG. 1 is a schematic diagram of a comparator circuit according to an embodiment of the present disclosure.

Referring to FIG. 1, FIG. 1 is a general schematic diagram of a comparator circuit according to an embodiment of the present disclosure. The comparator circuit is configured to compare an input voltage and a reference voltage to generate a comparison result. Description is made below with a differential input voltage as an example but is not intended to limit the present disclosure. The comparator circuit of the present disclosure may also be configured for a single-ended input voltage.

As shown in FIG. 1, the comparator circuit 100 includes a transistor switching circuit 110, a resistor circuit 120 and a current source circuit 130. The resistor circuit 120 is coupled between an input end of the comparator circuit 100 and an input end of the transistor switching circuit 110, and the current source circuit 130 is coupled to the input end of the transistor switching circuit 110. That is, a first end of the resistor circuit 120 is coupled to the input end of the comparator circuit 100, and a second end of the resistor circuit 120 is coupled to the input end of the transistor switching circuit 110.

The resistor circuit 120 is configured to receive in put voltages Vip and Vin, and the current source circuit 130 inputs a current to the second end of the resistor circuit 120 or drains the current from the second end of the resistor circuit 120. In some embodiments, the current source circuit 130 inputs currents Irn and Irp to the second end of the resistor circuit 120 or drains the currents Irn and Irp from the second end of the resistor circuit 120 to provide the reference voltage at the second end of the resistor circuit 120. In other words, the second end of the resistor circuit 120 outputs or receives the currents Irn and Irp from the current source circuit 130. Therefore, according to the Ohm law, the currents Irn and Irp and resistance of the resistor circuit 120 may be combined to generate the reference voltage. Herein, the current source circuit 130 may be implemented by one or more current sources.

In some embodiments, the currents Irn and Irp are constant currents respectively. In an example, the current source circuit 130 includes a constant current source circuit 131. The constant current source circuit 131 is coupled to the resistor circuit 120, and the constant current source circuit 131 outputs the constant currents Irn and Irp to the second end of the resistor circuit 120 (or drains the constant currents Irn and Irp from the second end of the resistor circuit 120).

Figure 2:
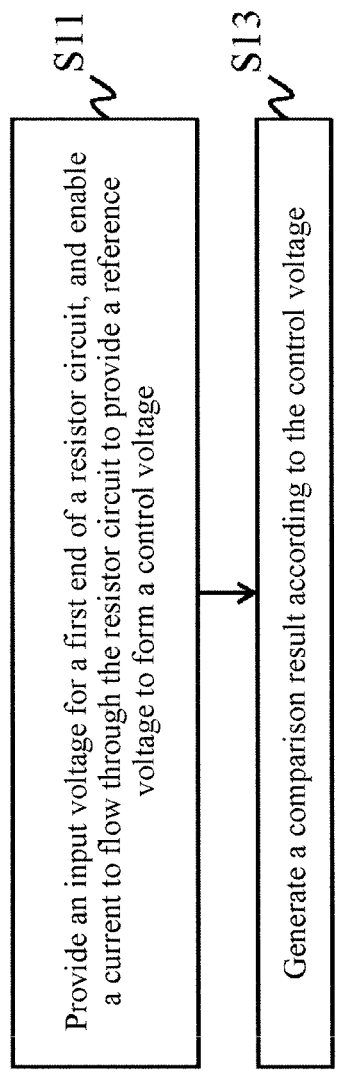
FIG. 2 is a flowchart of a comparison method according to an embodiment of the present disclosure.

Referring to both FIG. 1 and FIG. 2, the input end of the comparator circuit 100 receives the input voltages Vip and Vin, the input voltages Vip and Vin are provided for the first end of the resistor circuit 120 and the currents Irn and Irp flow through the resistor circuit 120 to provide the reference voltage to further form control voltages Vcp and Vcn (Step S11). In other words, the current source circuit 130 and the resistor circuit 120 generate the control voltages Vcp and Vcn according to the input voltages Vip and Vin and the currents Ira and Irp. In such case, the control voltages Vcp and Vcn are provided for the input end of the transistor switching circuit 110. Herein, the control voltages Vcp and Vcn are related to the reference voltage.

When the control voltages Vcp and Vcn are received at the input end of the transistor switching circuit 110, the transistor switching circuit 110 generates the comparison result according to the control voltages Vcp and Vcn (Step S13). Herein, the comparison result may be thermometer codes Dp and Dn. Furthermore, when Vcp>Vcn, the thermometer code Dp is 1, and the thermometer code Dn is 0; and on the contrary, when Vcp<Vcn, the thermometer code Dp is 1, and the thermometer code Dn is 0.

In some embodiments, the comparator circuit 100 further includes a latch circuit 150. The latch circuit 150 is coupled to an output end of the transistor switching circuit 110. The transistor switching circuit 110 generates the comparison result according to the control voltages Vcp and Vcn, and outputs the comparison result to the latch circuit 150 from the output end of the transistor switching circuit 110. The latch circuit 150 latches the thermometer codes Dp and Dn generated by the transistor switching circuit 110, and outputs the thermometer codes Dp and Dn from an output end of the comparator circuit 100 according to a clock pulse signal CK.

In some embodiments, currents Ion and Iop are further received by or drained from the second end of the resistor circuit 120 to provide a calibration voltage. In other words, according to the Ohm law, the currents Ion and Iop and the resistance of the resistor circuit 120 may be combined to achieve the calibration voltage to eliminate a voltage offset caused by a factor such as internal circuit mismatch.

In an example, the current source circuit 130 may further include an adjustable current source circuit 132, and the adjustable current source circuit 132 is coupled to the second end of the resistor circuit 120. The adjustable current source circuit 132 provides the currents Ion and Iop for the second end of the resistor circuit 120 or drains the currents Ion and Iop from the second end of the resistor circuit 120 to provide the calibration voltage at the second end of the resistor circuit 120.

In another example, the adjustable current source circuit 132 may be arranged outside the current source circuit 130 or the comparator circuit 100. In some embodiments, the adjustable current source circuit 132 is controlled by a control circuit 30, and the control circuit 30 may be arranged inside or outside the comparator circuit 100.

In an example, under the condition that the comparator circuit 100 does not execute a comparison operation, the control circuit 30 may short-circuit the two ends (the first end and the second end) of the resistor circuit 120 (which may be implemented by use of a switch controlled by the control circuit 30) and sense the output end of the comparator circuit 100 to obtain output of the latch circuit 150. Then, the control circuit 30 generates a setting signal Ss according to the output of the latch circuit 150 (for example, a comparison result obtained without comparison of the comparator circuit 100), and outputs the generated setting signal Ss to a control end of the adjustable current source circuit 132 to enable the adjustable current source circuit 132 to provide (output or drain) the required currents Ion and Iop according to the setting signal Ss. In an example, the control circuit 30 may find the setting signal Ss corresponding to the output of the latch circuit 150 by use of a lookup table.

In some embodiments, the adjustable current source circuit 132 may be implemented by one or more current sources.

It is to be noted that since offset calibration of the comparator circuit 100 is implemented at the input end of the transistor switching circuit 110, output capacitance at the output end of the comparator circuit 100 is quite low and the overall conversion speed of the comparator circuit 100 is further improved.

In some embodiments, the comparator circuit 100 may further include a coupling circuit 160, and the coupling circuit 160 is connected in parallel with the resistor circuit 120. Herein, the coupling circuit 160 may couple an alternating current (AC) signal to avoid a signal delay. Furthermore, a parasitic capacitor exists at the input end of the transistor switching circuit 110, and the parasitic capacitor forms an equivalent low-pass filter with the resistor circuit 120 respectively to further reduce the overall conversion speed of the comparator circuit 100. The input voltages Vip and Vin are coupled from the input end of the comparator circuit 100 to the input end of the transistor switching circuit 110 through the coupling circuit 160. From the input end of the comparator circuit 100, the resistor circuit 120 may not form an equivalent low-pass filter with the parasitic capacitor of the transistor switching circuit 110, so that the overall conversion speed of the comparator circuit 100 is further improved. In some examples, the coupling circuit 160 may be implemented by a capacitor with high capacitance.

In some embodiments, the comparator circuit 100 may further include a regulation current source circuit 180, and the regulation current source circuit 180 is coupled to the input end of the transistor switching circuit 110. The regulation current source circuit 180 provides a regulation current for the input end of the transistor switching circuit 110 so as to provide an input working voltage, in which the input working voltage is for the transistor switching circuit 110 to enable the transistor switching circuit 110 to work in a normal operating region. In the present embodiment, the working voltage may also be called a common mode voltage.

Figure 3:
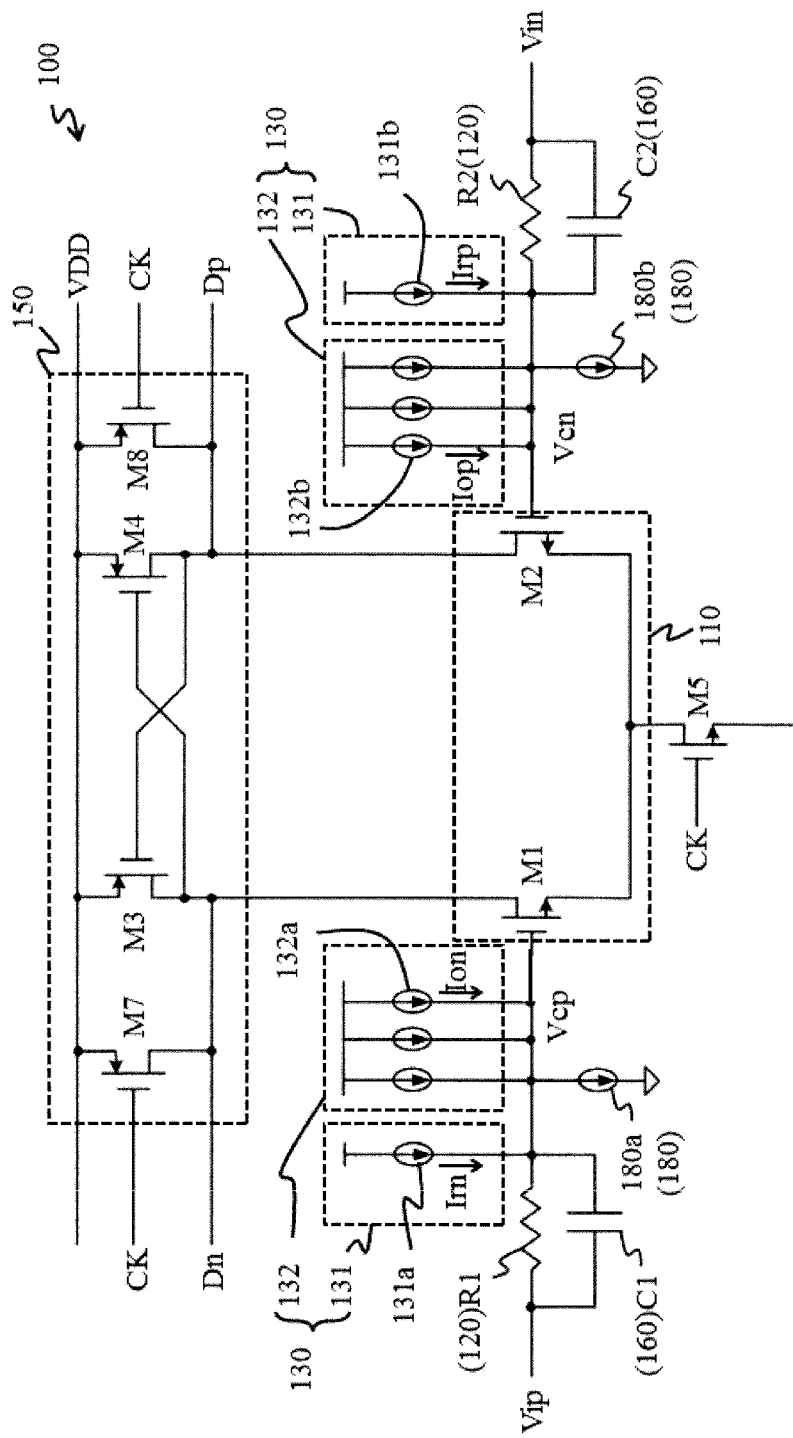
FIG. 3 is a circuit schematic diagram of a comparator circuit according to an embodiment of the present disclosure.

Referring to FIG. 3, FIG. 3 is a circuit schematic diagram of a comparator circuit 100 according to an embodiment of the present disclosure. The transistor switching circuit 110 includes a transistor M1 and a transistor M2, and a source of the transistor M1 is coupled to a source of the transistor M2. A drain of the transistor M1 and a drain of the transistor M2 are coupled to the latch circuit 150. The source of the transistor M1 and the source of the transistor M2 are also coupled and grounded through a switching transistor M5. Herein, the switching transistor M5 is controlled by the clock pulse signal CK.

The resistor circuit 120 includes a resistor R1 and a resistor R2. A first end of the resistor R1 is coupled to a first input end of the comparator circuit 100, and a second end of the resistor R1 is coupled to a gate of the transistor M1. A first end of the resistor R2 is coupled to a second input end of the comparator circuit 100, and a second end of the resistor R2 is coupled to a gate of the transistor M2.

In some embodiments, parasitic capacitors exist at the gates of the transistor M1 and the transistor M2, and the parasitic capacitors may form equivalent low-pass filters with the corresponding resistor R1 and resistor R2 respectively to further reduce the overall speed of the comparator circuit 100. In order to solve this problem, the coupling circuit 160 is connected in parallel with the resistor circuit 120, and, that is, a capacitor C1 is connected in parallel with the resistor R1, and a capacitor C2 is connected in parallel with the resistor R2. Herein, the capacitor C1 and the capacitor C2 couple the input voltage Vip and the input voltage Vin to the gates of the transistor M1 and the transistor M2 respectively. Therefore, influence of the parasitic capacitors of the transistor M1 and the transistor M2 on the speed of the comparator circuit 100 is further eliminated.

The latch circuit 150 includes a transistor cross-coupled pair. The transistor cross-coupled pair includes two cross-coupled transistors (for example, a transistor M3 and a transistor M4). A drain of the transistor M3 is coupled to the drain of the transistor M1 and a second output end of the comparator circuit. A drain of the transistor M4 is coupled to the drain of the transistor M2 and a first output end of the comparator circuit 100. A source of the transistor M3 and a source of the transistor M4 are coupled to a power supply VDD. A switching transistor M7 is connected in parallel between the source and the drain of the transistor M3, and a switching transistor M8 is connected in parallel between the source and the drain of the transistor M4. Herein, the switching transistors M7 and M8 are controlled by the clock pulse signal CK.

When the comparator circuit 100 executes the comparison operation, the first end of the resistor R1 receives the input voltage Vip, and the second end of the resistor R1 receives the current Irn from the current source circuit 130 or drains the current Irn from the current source circuit 130. Similarly, the first end of the resistor R2 receives the input voltage Vin, and the second end of the resistor R2 receives the current Irp from the current source circuit 130 or drains the current Irp from the current source circuit 130. Then, the transistor M1 and the transistor M2 form the thermometer codes Dn and Dp according to a level control voltage Vcp and a level control voltage Vcn. Furthermore, if resistances of the resistors R1 and R2 are R, respectively, when Vip−Vin>(Irp−Irn)*R, the thermometer code Dp is 1 and the thermometer code Dn is 0; and correspondingly, when Vip−Vin<(Irp−Irn)*R, the thermometer code Dp is 0 and the thermometer code Dn is 1. Herein, (Irp−Irn)*R may be considered as the reference voltage. Then, the latch circuit 150 outputs the thermometer codes Dn and Dp from the second output end and the first output end of the comparator circuit, respectively, according to the clock pulse signal CK.

In some embodiments, the constant current source circuit 131 includes two constant current sources 131*a* and 131*b*. The constant current source 131*a* is coupled to the second end of the resistor R1, and is configured to provide the current Irn. The constant current source 131*b* is coupled to the second end of the resistor R2, and is configured to provide the current Irp.

In an embodiment, the adjustable current source circuit 132 may include two groups of adjustable current sources 132*a* and 132*b*. The adjustable current source 132*a* is coupled to the second end of the resistor R1, and is configured to provide the current Ion. The adjustable current source 132*b* is coupled to the second end of the resistor R2, and is configured to provide the current Iop. The currents Ion and Iop and the resistance of the resistors R1 and R2 may be combined to achieve the calibration voltage to eliminate the voltage offset caused by a factor such as internal circuit mismatch. Herein, the currents Ion and Iop provided by the adjustable current sources 132*a* and 132*b* may be regulated by a control signal (for example, the control signal Ss shown in FIG. 1).

In an embodiment, the regulation current source circuit 180 may include two groups of regulation current sources 180*a* and 180*b*. The regulation current source 180*a* is coupled to the second end of the resistor R1, the regulation current source 180*b* is coupled to the second end of the resistor R2, and the regulation current sources 180*a* and 180*b* are configured to provide the currents for the second ends of the resistors R1 and R2 respectively to provide input common mode voltages for the transistor M1 and the transistor M2 to enable the transistor M1 and the transistor M2 to work in the normal operating region.

In some embodiments, the comparator circuit 100 may also compare a single-ended input voltage and the reference voltage. For example, the input voltage Vip is considered as a single-ended input voltage, the reference voltage is generated by use of the constant current source 131*a* and the resistor R1, and the thermometer code Dn is considered as the comparison result.

Figure 4:
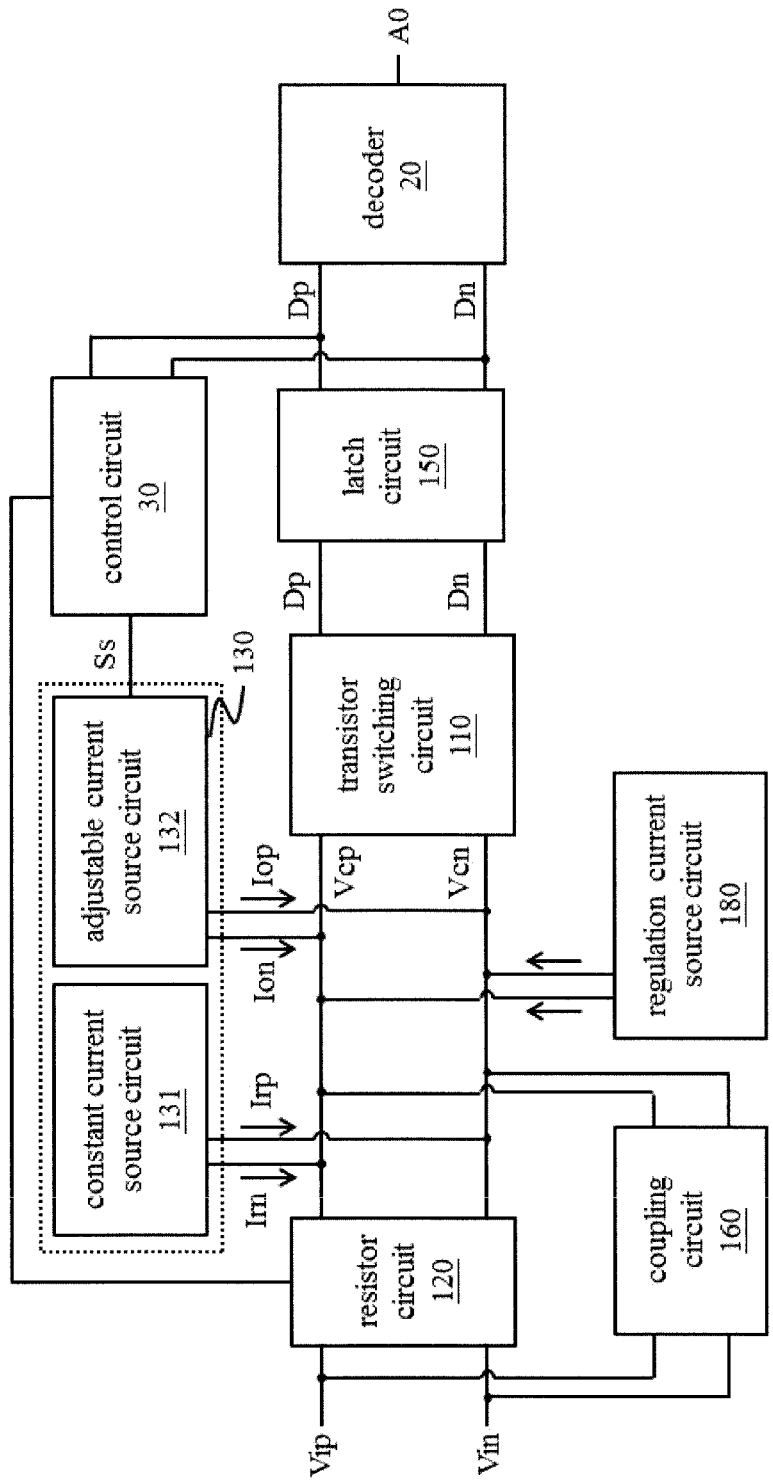
FIG. 4 is a general schematic diagram of an ADC according to an embodiment of the present disclosure.

In some embodiments, the comparator circuit 100 may be applied to a flash ADC. Referring to FIG. 4, the flash ADC may include the comparator circuit of any above-mentioned embodiment and a decoder 20. An output end of the comparator circuit is coupled to the decoder 20.

The comparator circuit includes at least a transistor switching circuit 110, a resistor circuit 120 and a constant current source circuit 131. Configurations and operations of these circuits are substantially the same as those described above and thus is not elaborated. The decoder 20 implements conversion from thermometer codes Dp and Dn into a digital signal A0, i.e., a digital signal A0 in a binary form.

Based on the above, output capacitance of the output end of a comparison stage can be lower by adopting the comparator circuit, comparison method and flash ADC of the present disclosure, so that the overall speed may be relatively improved.

What is claimed is:

1. A comparator circuit, applied to compare an input voltage and a reference voltage to generate a comparison result, the input voltage comprising a first input voltage and a second input voltage, the comparator circuit comprising:
a resistor circuit, configured to receive the first input voltage and the second input voltage;
a current source circuit, configured to provide a first current and a second current, wherein the first current, the second current and the resistor circuit are configured to generate the reference voltage; and
a transistor switching circuit, comprising an input end and an output end, the transistor switching circuit being configured to generate the comparison result at the output end according to a first control voltage and a second control voltage at the input end, wherein the current source circuit and the resistor circuit are configured to generate the first control voltage according to the first current and the first input voltage, and generate the second control voltage according to the second current and the second input voltage.

2. The comparator circuit according to claim 1, further comprising:
a coupling circuit, connected in parallel with the resistor circuit and configured to couple the first input voltage and the second input voltage to the input end of the transistor switching circuit.

3. The comparator circuit according to claim 1, further comprising:
a latch circuit, coupled to the output end of the transistor switching circuit and configured to output the comparison result.

4. The comparator circuit according to claim 1, wherein the current source circuit comprises:
a constant current source, configured to provide the first current and the second current; and
an adjustable current source circuit, configured to provide a third current and a fourth current, wherein the third current, the fourth current and the resistor circuit are configured to generate a calibration voltage at the input end of the transistor switching circuit to calibrate the comparator circuit.

5. The comparator circuit according to claim 1, further comprising:
an adjustable current source circuit, configured to provide the third current and the fourth current, wherein the third current, the fourth current and the resistor circuit are configured to generate a calibration voltage at the input end of the transistor switching circuit to calibrate the comparator circuit.

6. The comparator circuit according to claim 5, wherein the adjustable current source circuit provides the third current and the fourth current according to a setting signal output by a setting circuit, and the setting circuit is configured to generate the setting signal according to the comparison result when the resistor circuit is short-circuited.

7. The comparator circuit according to claim 1, further comprising:
a regulation current source circuit, configured to provide a first regulation current and a second regulation current, wherein the first regulation current, the second regulation current and the resistor circuit are configured to generate a working voltage at the input end of the transistor switching circuit to enable the transistor switching circuit to work in a normal operating region.

8. The comparator circuit according to claim 7, wherein the working voltage is a common mode voltage.

9. A comparator circuit, applied to compare an input voltage and a reference voltage to generate a comparison result, comprising:
a resistor circuit, configured to receive the input voltage;
a current source circuit, configured to provide a first current, wherein the first current and the resistor circuit are configured to generate the reference voltage; and
a transistor switching circuit, comprising an input end and an output end, the transistor switching circuit being configured to generate the comparison result at the output end according to a control voltage at the input end, wherein the current source circuit and the resistor circuit are configured to generate the control voltage according to the input voltage and the reference voltage.

10. The comparator circuit according to claim 9, further comprising:
a coupling circuit, connected in parallel with the resistor circuit and configured to couple the input voltage to the input end of the transistor switching circuit.

11. The comparator circuit according to claim 9, further comprising:
a latch circuit, coupled to the output end of the transistor switching circuit and configured to output the comparison result.

12. The comparator circuit according to claim 9, wherein the current source circuit comprises:
a constant current source, configured to provide the first current; and
an adjustable current source circuit, configured to provide a second current, wherein the second current and the resistor circuit are configured to generate a calibration voltage to calibrate the comparator circuit.

13. The comparator circuit according to claim 9, further comprising:
an adjustable current source circuit, configured to provide the second current, wherein the second current and the resistor circuit are configured to generate a calibration voltage to calibrate the comparator circuit.

14. The comparator circuit according to claim 9, further comprising:
a regulation current source circuit, configured to provide a regulation current, wherein the regulation current and the resistor circuit are configured to generate a working voltage at the input end of the transistor switching circuit to enable the transistor switching circuit to work in a normal operating region.

15. An analog to digital converter (ADC), applied to convert an input voltage into a digital signal, the input voltage comprising a first input voltage and a second input voltage, the ADC comprising:
a resistor circuit, configured to receive the first input voltage and the second input voltage;
a current source circuit, configured to provide a first current and a second current;
a transistor switching circuit, comprising an input end and an output end, the transistor switching circuit being configured to generate a comparison result at the output end according to a first control voltage and a second control voltage at the input end, wherein the current source circuit and the resistor circuit are configured to generate the first control voltage according to the first current and the first input voltage, and generate the second control voltage according to the second current and the second input voltage; and
a decoder, configured to convert the comparison result into the digital signal.

16. The ADC according to claim 15, further comprising:
a coupling circuit, connected in parallel with the resistor circuit and configured to couple the first input voltage and the second input voltage to the input end of the transistor switching circuit.

17. The ADC according to claim 15, further comprising:
a latch circuit, coupled to the output end of the transistor switching circuit and configured to output the comparison result to the decoder.

18. The ADC according to claim 15, wherein the current source circuit comprises:
a constant current source, configured to provide the first current and the second current; and
an adjustable current source circuit, configured to provide a third current and a fourth current, wherein the third current, the fourth current and the resistor circuit are configured to generate a calibration voltage at the input end of the transistor switching circuit.

19. The ADC according to claim 15, further comprising:
an adjustable current source circuit, configured to provide the third current and the fourth current, wherein the third current, the fourth current and the resistor circuit are configured to generate a calibration voltage at the input end of the transistor switching circuit.

20. The ADC according to claim 15, further comprising:
a regulation current source circuit, configured to provide a regulation current, wherein the regulation current and the resistor circuit are configured to generate a common mode voltage at the input end of the transistor switching circuit to enable the transistor switching circuit to work in a normal operating region.

* * * * *